US007890819B2

(12) United States Patent
Charlton et al.

(10) Patent No.: US 7,890,819 B2
(45) Date of Patent: *Feb. 15, 2011

(54) METHOD AND APPARATUS FOR STORING FAILING PART LOCATIONS IN A MODULE

(75) Inventors: David E. Charlton, Star, ID (US); Sovandy N. Prak, Meridian, ID (US); Keith E. Robinson, Caldwell, ID (US)

(73) Assignee: Micron Technology, Inc., Boise, ID (US)

(*) Notice: Subject to any disclaimer, the term of this patent is extended or adjusted under 35 U.S.C. 154(b) by 845 days.

This patent is subject to a terminal disclaimer.

(21) Appl. No.: 11/725,292

(22) Filed: Mar. 19, 2007

(65) Prior Publication Data

US 2007/0288805 A1 Dec. 13, 2007

Related U.S. Application Data

(63) Continuation of application No. 09/548,826, filed on Apr. 13, 2000, now Pat. No. 7,269,765.

(51) Int. Cl.
*G11C 29/00* (2006.01)
*G11C 7/00* (2006.01)
*G06F 11/00* (2006.01)

(52) U.S. Cl. .......................... 714/710; 714/42; 365/201

(58) Field of Classification Search ......... 714/710–711, 714/718, 719, 723; 365/200–201
See application file for complete search history.

(56) References Cited

U.S. PATENT DOCUMENTS 3,714,637 A 1/1973 Beausoleil
3,715,735 A 2/1973 Moss
3,735,368 A 5/1973 Beausoleil
3,772,652 A 11/1973 Hilberg
3,781,826 A 12/1973 Beausoleil
3,800,294 A 3/1974 Lawlor
3,845,476 A 10/1974 Boehm
4,355,376 A 10/1982 Gould (Continued)

FOREIGN PATENT DOCUMENTS

WO WO 9938075 A1 * 7/1999

OTHER PUBLICATIONS

"Replaceable chip module (RCMTM)" by Rathburn, J This paper appears in: Multichip Modules and High Density Packaging, 1998. Proceedings. 1998 International Conference on Publication Date: Apr. 15-17, 1998 On pp. 393-398 ISBN: 0-7803-4850-8 INSPEC Accession No. 6046786.*

(Continued)

*Primary Examiner*—Cynthia Britt
(74) *Attorney, Agent, or Firm*—TraskBritt

(57) ABSTRACT

A non-volatile storage device on a memory module comprising a plurality of memory devices is used to store the locations of defective parts on the memory module, such as data query ("DQ") terminals, identified during a testing procedure. After testing, the non-volatile storage device, such as an electrically erasable programmable read only memory ("EEPROM"), may be accessed to determine specific memory devices such as dynamic random access memory ("DRAM") which need to be repaired or replaced rather than re-testing the specific memory module.

17 Claims, 2 Drawing Sheets

60
CACHE 74
64
PROCESSOR
DRAM 62
63
INPUT DEVICE 68
OUTPUT DEVICE 70
DATA STORAGE 72

U.S. PATENT DOCUMENTS 4,376,300 A 3/1983 Tsang
4,450,560 A 5/1984 Conner
4,475,194 A 10/1984 LaVallee et al.
4,479,214 A 10/1984 Ryan
4,493,075 A 1/1985 Anderson et al.
4,527,251 A 7/1985 Nibby, Jr. et al.
4,646,299 A 2/1987 Schinabeck et al.
4,807,191 A 2/1989 Flannagan
4,837,747 A 6/1989 Dosaka et al.
4,876,685 A 10/1989 Rich
4,881,200 A 11/1989 Urai
4,908,798 A 3/1990 Urai
4,918,662 A 4/1990 Kondo
4,935,899 A 6/1990 Morigami
4,992,984 A 2/1991 Busch et al.
5,051,994 A 9/1991 Bluethman et al.
5,060,197 A 10/1991 Park et al.
5,124,948 A 6/1992 Takizawa et al.
5,126,973 A 6/1992 Gallia et al.
5,134,584 A 7/1992 Boler et al.
5,200,959 A 4/1993 Gross et al.
5,208,775 A 5/1993 Lee
5,233,614 A 8/1993 Singh
5,243,570 A 9/1993 Saruwatari
5,251,174 A 10/1993 Hwang
5,268,866 A 12/1993 Feng et al.
5,270,974 A 12/1993 Reddy
5,270,976 A 12/1993 Tran
5,315,552 A 5/1994 Yoneda
5,327,380 A 7/1994 Kersh, III et al.
5,331,188 A 7/1994 Acovic et al.
5,332,922 A 7/1994 Oguchi et al.
5,337,277 A 8/1994 Jang
5,349,556 A 9/1994 Lee
5,371,866 A 12/1994 Cady
5,379,415 A 1/1995 Papenberg et al.
5,390,129 A 2/1995 Rhodes
5,392,247 A 2/1995 Fujita
5,400,263 A 3/1995 Rohrbaugh et al.
5,400,342 A 3/1995 Matsumura et al.
5,406,565 A 4/1995 MacDonald
5,410,545 A 4/1995 Porter et al.
5,424,989 A 6/1995 Hagiwara et al.
5,434,792 A 7/1995 Saka et al.
5,465,234 A 11/1995 Hannai
5,469,390 A 11/1995 Sasaki et al.
5,475,648 A 12/1995 Fujiwara
5,475,695 A 12/1995 Caywood et al.
5,491,664 A 2/1996 Phelan
5,497,381 A 3/1996 O'Donoghue et al.
5,502,333 A 3/1996 Bertin et al.
5,513,135 A 4/1996 Dell et al.
5,513,327 A 4/1996 Farmwald et al.
5,528,553 A 6/1996 Saxena
5,535,328 A 7/1996 Harari et al.
5,539,697 A 7/1996 Kim et al.
5,544,106 A 8/1996 Koike
5,548,553 A 8/1996 Cooper et al.
5,553,231 A 9/1996 Papenberg et al.
5,576,999 A 11/1996 Kim et al.
5,588,115 A 12/1996 Augarten
5,600,258 A 2/1997 Graham et al.
5,602,987 A 2/1997 Harari et al.
5,631,868 A 5/1997 Termullo, Jr. et al.
5,633,826 A 5/1997 Tsukada
5,636,173 A 6/1997 Schaefer
5,654,204 A 8/1997 Anderson
5,668,763 A 9/1997 Fujioka et al.
5,717,694 A 2/1998 Ohsawa
5,734,621 A 3/1998 Ito
5,745,673 A 4/1998 Di Zenzo et al.
5,754,753 A 5/1998 Smelser
5,758,056 A 5/1998 Barr
5,768,173 A 6/1998 Seo et al.
5,798,961 A * 8/1998 Heyden et al. ................ 365/52
5,798,962 A 8/1998 Di Zenzo et al.
5,841,710 A 11/1998 Larsen
5,862,314 A 1/1999 Jeddeloh
5,896,346 A 4/1999 Dell et al.
5,913,020 A 6/1999 Rohwer
5,920,512 A 7/1999 Larsen
5,920,513 A 7/1999 Jacobson
5,956,233 A 9/1999 Yew et al.
5,963,463 A 10/1999 Rondeau, II et al.
5,966,724 A 10/1999 Ryan
5,970,008 A 10/1999 Zagar et al.
5,974,564 A 10/1999 Jeddeloh
5,991,215 A 11/1999 Brunelle
5,995,409 A 11/1999 Holland
5,996,096 A 11/1999 Dell et al.
6,009,536 A 12/1999 Rohwer
6,035,432 A 3/2000 Jeddeloh
6,058,055 A 5/2000 Brunelle
6,115,828 A 9/2000 Tsutsumi et al.
6,130,442 A 10/2000 DiZenzo et al.
6,141,768 A 10/2000 Lin et al.
6,154,851 A * 11/2000 Sher et al. ...................... 714/5
6,208,804 B1 3/2001 Ottesen et al.
6,229,323 B1 5/2001 Tverdy et al.
6,256,756 B1 7/2001 Faulk, Jr.
6,274,395 B1 8/2001 Weber
6,330,693 B1 12/2001 Lindsay
6,332,183 B1 12/2001 Weber et al.
6,341,090 B1 1/2002 Hiraki et al.
6,345,367 B1 2/2002 Sinclair
6,381,707 B1 4/2002 Larsen et al.
6,381,708 B1 4/2002 Larsen et al.
6,418,066 B1 7/2002 Hidalka
6,438,029 B2 8/2002 Hiraki et al.
6,463,550 B1 * 10/2002 Cepulis et al. ................ 714/25
6,467,054 B1 10/2002 Lenny
6,467,056 B1 10/2002 Satou et al.
6,477,672 B1 11/2002 Satoh
6,496,876 B1 12/2002 Rohwer
6,567,941 B1 5/2003 Turnquist
6,651,202 B1 11/2003 Phan
6,873,555 B2 3/2005 Hiraki et al.

OTHER PUBLICATIONS

Shanley, Tom, et al., *ISA System Architecture*, 3rd Ed., pp. 126-132 & 221-232,1995.

Intel, *PC SDRAM Unbuffered DIMM Specification*, Revision 1.0, Feb. 1998.

Intel, *PC SDRAM Specification*, Revision 1.63, Oct. 1998.

Partial Memory Engine PME v6, Memory Corporation MY11-00600-01, Advanced Data, Jul. 1998 (7 pages).

* cited by examiner

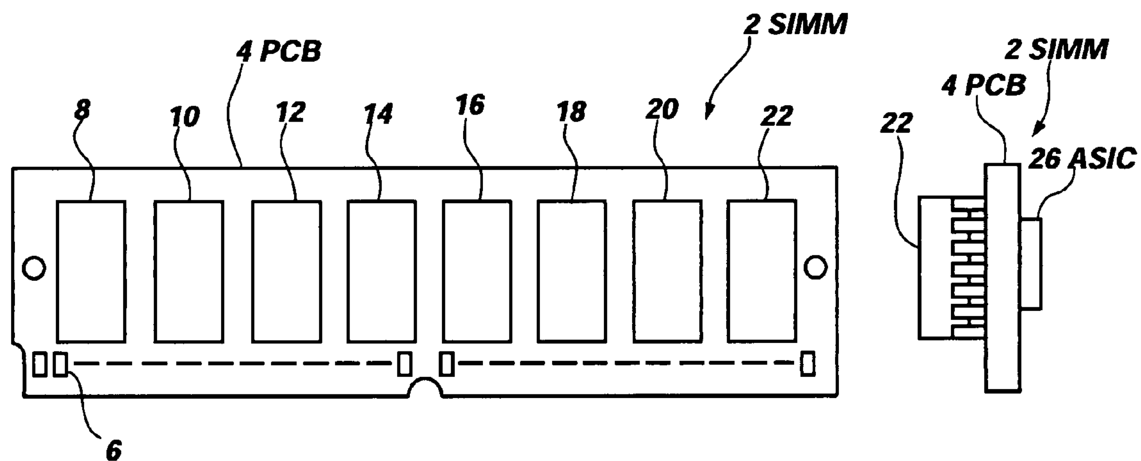
Fig. 1
(PRIOR ART)
Fig. 2
(PRIOR ART)
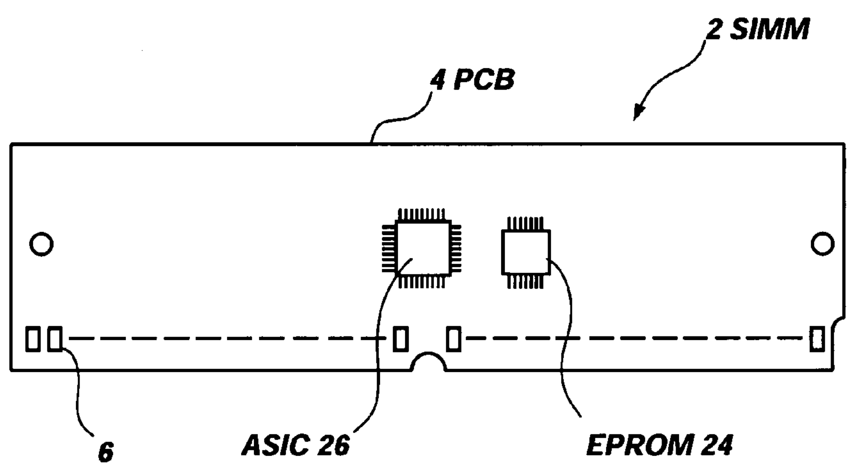
Fig. 3
(PRIOR ART)

METHOD AND APPARATUS FOR STORING FAILING PART LOCATIONS IN A MODULE

CROSS-REFERENCE TO RELATED APPLICATION

This application is a continuation of application Ser. No. 09/548,826, filed Apr. 13, 2000, now U.S. Pat. No. 7,269,765, issued Sept. 11, 2007. The disclosure of the previously referenced U.S. patent application is hereby incorporated by reference in its entirety.

BACKGROUND OF THE INVENTION

1. Field of the Invention

The present invention relates generally to the use of a non-volatile storage device, such as an electrically erasable programmable read only memory device ("EEPROM"), to store information regarding the location of failed parts on a multi-chip module such as a memory module. More particularly, the present invention relates to storing, in an on-module EEPROM, the identities of module output terminals, such as data query ("DQ") terminals which, during testing of the module, have been determined to fail and are thus indicative of the locations of corresponding failed components.

2. State of the Art

Recent computer memory modules include a non-volatile storage device, such as an electrically erasable programmable read only memory device ("EEPROM"), an erasable programmable read only memory device ("EPROM"), a ferro-electronic device or a Flash memory chip, on the memory module with other volatile storage devices such as random access memory ("RAM"), synchronous dynamic random access memory ("SDRAM") and dynamic random access memory ("DRAM"). Volatile storage devices are those memory devices in which information stored in a memory cell in the device is completely lost when the power supply voltage applied to the memory cell is interrupted or turned off. In contrast, information stored in the cells of non-volatile storage devices is preserved when the power supply is turned off. A non-volatile storage device on a memory module is conventionally used to store valuable configuration information necessary for the processor to access the memory on the module. The configuration information stored on the non-volatile storage device includes such parameters as the latency and speed of the module components and the size and type of memory module, and is accessed by the processor during initialization of the system. The memory of the EEPROM is divided into sections, each section storing a different category of information.

Typically, however, the capacity of the EEPROM, or other long-term memory storage device, is greater than the memory requirements for the configuration information that needs to be stored. The industry has established a standard of a minimum of 128 bytes as the volume of configuration data to be stored on the non-volatile storage device. Therefore, any EEPROM memory (in excess of 128 bytes) remaining unused may be used to store additional information that is not material to the functionality of the module. The memory capacity of an EEPROM in excess of 128 bytes varies by the capacity of the EEPROM used.

U.S. Pat. No. 5,996,096 to Dell et al., issued Nov. 30, 1999, the disclosure of which is hereby incorporated herein by reference, discloses using the excess memory capacity of an EPROM mounted on a memory module to store a map of the bad memory addresses of "reduced specification DRAM chips" (e.g., chips with nonfunctional memory addresses or partially defective DRAM chips) for use during operation of the memory module. According to the invention of Dell et al., each of a plurality of memory chips or dice is coded and marked with a unique identifier and tested in accordance with conventional testing methods. FIGS. 1-3 depict an example of the invention of Dell et al. using a 72 pin single in-line memory module ("SIMM") 2 comprising a printed circuit board ("PCB") 4 having a plurality of electrical contacts 6 (72 in the illustrated example) along one edge. Those tested memory chips having one or more bad memory cells are identified as "reduced specification chips" 8, 10, 12, 14, 16, 18, 20 and 22 and are placed together on the SIMM 2. The reduced specification chips 8, 10, 12, 14, 16, 18, 20 and 22 are identified and their positions recorded using their respective unique identifiers (not shown). The address maps which identify specific bad addresses for each of the chips 8, 10, 12, 14, 16, 18, 20 and 22 are programmed into an EPROM 24 placed on the PCB 4 and associated with each of the respective unique identifiers of the chips 8, 10, 12, 14, 16, 18, 20 and 22. During later testing or operation of the memory module, the address map stored in the EPROM 24 is routinely accessed and updated by system processes to enable a logic device 26, such as an application-specific integrated circuit ("ASIC") or other programmable logic device that contains the bit steering logic and timing generation logic, to redirect the data for defective DRAM addresses to an alternate storage device for all read and write operations in real time.

Memory Corporation of the United Kingdom sells a dual in-line memory module built with a number of partially defective SDRAM dice. The synchronous dynamic random access memory dice ("SDRAM") used on the dual in-line memory module ("DIMM") are selected to ensure that the total number of defects is within the mapping capabilities of the ASIC. A map of the defective locations is stored in a serial EEPROM mounted on the DIMM. The mapping data is loaded into the ASIC at power-up together with the configuration information to redirect the data for defective DRAM addresses to an alternate storage device.

U.S. Pat. No. 5,963,463 to Rondeau, II et al., issued Oct. 5, 1999, the disclosure of which is hereby incorporated herein by reference, also discloses an example of a memory module and method employing an EEPROM. According to the method of Rondeau, II et al., an EEPROM is programmed with module information after completion of the memory module assembly.

Memory chip manufacturers conventionally employ chip-testing systems to individually test each memory chip. These systems test the operability of each memory chip by writing a value into each memory cell within the chip and then reading the contents of that cell. An example of an individual chip testing system is described in U.S. Pat. No. 5,991,215 to Brunelle, issued Nov. 23, 1999, the disclosure of which is hereby incorporated herein by reference.

The DRAM dice of memory modules are tested subsequent to connection to the memory module's printed circuit board ("PCB") in addition to testing the individual DRAM dice prior to connection because failures may be caused by connection of the dice to the PCB or by the combination of the particular module components. After module testing, the memory modules are reworked, repaired, scrapped, stripped, repinned, rebuilt onto a module, depopulated or "depopped" (memory chips are removed from a module to re-run through chip testing) or sold as a depop product as is well known to one of ordinary skill in the art. Presently, memory modules are tested one module at a time in a wide range of tests to evaluate such things as speed, margin, voltage ranges, output and input levels, data patterns, functionality and connectivity of printed circuits, as well as being performance tested by operation in personal computers produced by various manufacturers, etc. To identify which specific DRAMs on a module fail one or more in a series of memory tests, the operator must either closely watch the tester monitor and record the location of a failing DRAM on a display map while the tester is testing the next module, or retest a module identified as having a failed DRAM. Because performance requirements for memory modules are constantly increasing, module testing processes are likewise becoming more complex and, consequently, longer and more expensive. Understandably, the cost of equipment to perform these more complex tests is also increasing. Present module testers may cost anywhere from $1.2-3 million each. Including module handlers, a module tester system may cost anywhere from $1.7-3.5 million.

To help reduce overall cost in these more expensive testers, module tester designers have added the ability to test multiple memory modules in parallel rather than one at a time. Examples of such memory module testers are manufactured by Advantest America, Inc., of Santa Clara, Calif., and Teradyne, Inc. of Boston, Mass. Module testers that can test up to 16 modules at a time are presently in development, though this number and the cost of equipment for testing modules will certainly continue to increase as performance requirements increase.

To illustrate how the testing process may affect the cost of a memory module, consider the following example. A process that can test 16 memory modules in parallel through a five-minute test would produce 192 modules per hour. Assuming a 25% failure rate, which is not atypical, there would be 48 of the 192 memory modules tested that fail the test process. However, when testing 16 modules at a time in parallel, identifying and marking failures by watching a test monitor during testing is no longer feasible. The modules identified as failed are therefore retested, one at a time, to identify which parts failed for each module. Due to parallelism, the time it takes to test one module or 16 modules is the same (5 minutes). Therefore, it would take a minimum of 4 hours (48 modules ×5 min./module) to find the defects on the 48 failing modules.

The depreciation cost alone on a $1.7 million module tester system is roughly $39 per hour. Thus, the initial module test cost resulting from the equipment alone is $.20 per module. Contrarily, the cost to retest the 48 failures discovered during the initial test is $3.25 per module, a significant increase over the initial test cost. This results in an average module testing cost before rework of $1.02 per module, five times more expensive than without the retesting. It is thus desirable to have a method of testing memory modules that avoids the costly retesting of the memory modules.

SUMMARY OF THE INVENTION

The present invention addresses the problem of how to avoid the conventional, costly step of retesting memory modules identified as failing during the initial testing of the module by storing the identity of failed module components in a non-volatile memory device such as an EEPROM. Failed module components include such elements as data query ("DQ") terminals and memory bits that require memory mapping of bad addresses. A plurality of memory dice may be placed on a memory module with other module components and the module then tested to identify any failed outputs. The locations of failed component parts, such as memory dice, are determinable from the failed output identifiers that are stored during testing in a non-volatile storage device for access after the testing process. By storing the failed output identities on the memory module itself, locations of specific defective parts may be easily identified and immediately repaired or replaced without the requirement of an additional memory module test, or a requirement of maintaining an association between a particular memory module and its test data. Other module or die information may also be stored on the memory module, such as lot identification numbers or other production information, for access at a later time.

BRIEF DESCRIPTION OF THE SEVERAL VIEWS OF THE DRAWINGS

The nature of the present invention as well as other embodiments of the present invention may be more clearly understood by reference to the following detailed description of the invention, to the appended claims, and to the several drawings herein, wherein:

FIG. 1 is a front view of a prior art SIMM DRAM assembly;

FIG. 2 is a side view of the prior art SIMM DRAM assembly of FIG. 1;

FIG. 3 is a back view of the prior art SIMM DRAM assembly of FIG. 1;

DETAILED DESCRIPTION OF THE INVENTION

Figure 4:
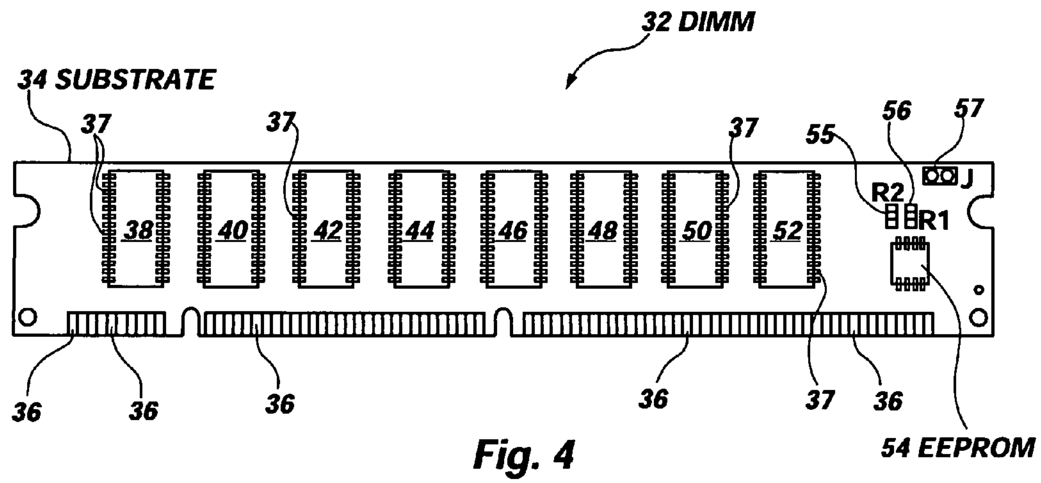
FIG. 4 is an illustration of a DIMM DRAM assembly according to the present invention.

FIG. 4 illustrates a dynamic random access memory ("DRAM") dual in-line memory module ("DIMM") 32. The DIMM 32 shown comprises a printed circuit board ("PCB") 34, or other carrier substrate bearing circuit traces, having a plurality of electrical contacts 36 (numbering 168 in the illustrated example, 84 on each side) along one edge. Each of the electrical contacts 36 is coupled to at least one of a plurality of terminals 37 of functional DRAMs 38, 40, 42, 44, 46, 48, 50 and 52, or an EEPROM 54. The DIMM 32 also includes two impedance resistors 55 and 56 and a temporary connection jumper 57.

According to an embodiment of the present invention, a plurality of DRAM dice or chips that have previously been individually tested and determined to be fully functional, or at least functional to an extent usable within a particular application, such as a partially good die is included on the DIMM 32. Additionally, more stringent tests may be performed prior to affixation of a given die to a module to establish that a die is also a "known good die" ("KGD"). The functional DRAMs 38, 40, 42, 44, 46, 48, 50 and 52 are then attached, by wire bonding, TAB bonding, flip-chip bonding or other method known in the art, to bond pads (not shown) on the PCB 34 to form the DIMM 32. The DIMM 32 is tested using conventional equipment known in the art such as that previously referenced herein. The identities of any outputs, such as data query ("DQ") terminals, which fail any of the tests in a testing process are detected and recorded in the excess memory of the EEPROM 54 through programming. The identities of the failed outputs may be recorded either immediately as each fails a test, or at some point subsequent to the test failure, such as at the completion of all tests involving a particular part or at completion of the module test process.

Upon completion of the module test process, unlike prior test methods, if a module is identified as having a failed output, rather than retesting the module to identify the specific module part which failed the test, the portion of the EEPROM storing the identities of the failed outputs may be accessed using methods known in the art to identify which DRAM, or other module component, needs to be replaced. In this way, the costly retesting step for identifying defective parts on failed modules is unnecessary.

One particular advantage of the present invention is that it may be implemented without costly additional equipment. By modifying the test process software to program the identities of failing outputs into unused portions of the memory in an EEPROM, the advantages of the invention may be achieved. Upon completion of the testing process, any modules that failed the test may then be placed in an inexpensive apparatus as known in the art where the EEPROM may be read for the identities or locations of terminals and a failure map displayed. From the identities of the failing terminals, the corresponding failing part may be identified and marked for repair or replacement. After repair or replacement, the memory module may again be tested and the process repeated until none of the module parts fail a test.

It is contemplated that the process of the present invention will be particularly beneficial to identifying failed DRAMs, as the failure rate of DRAMs is relatively high. However, as will be clear to one of ordinary skill in the art, the method and apparatus of the present invention may be applied to any testing process where it would be advantageous to have a data record indicative of failed part locations on-board the memory module. It will be understood by those having skill in the technical field of this invention that the invention is applicable to any multi-chip module including a non-volatile storage device including, for example, and without limitation thereto, DRAMs, SIMMs, DIMMs and Rambus in-line memory modules ("RIMM").

Figure 5:
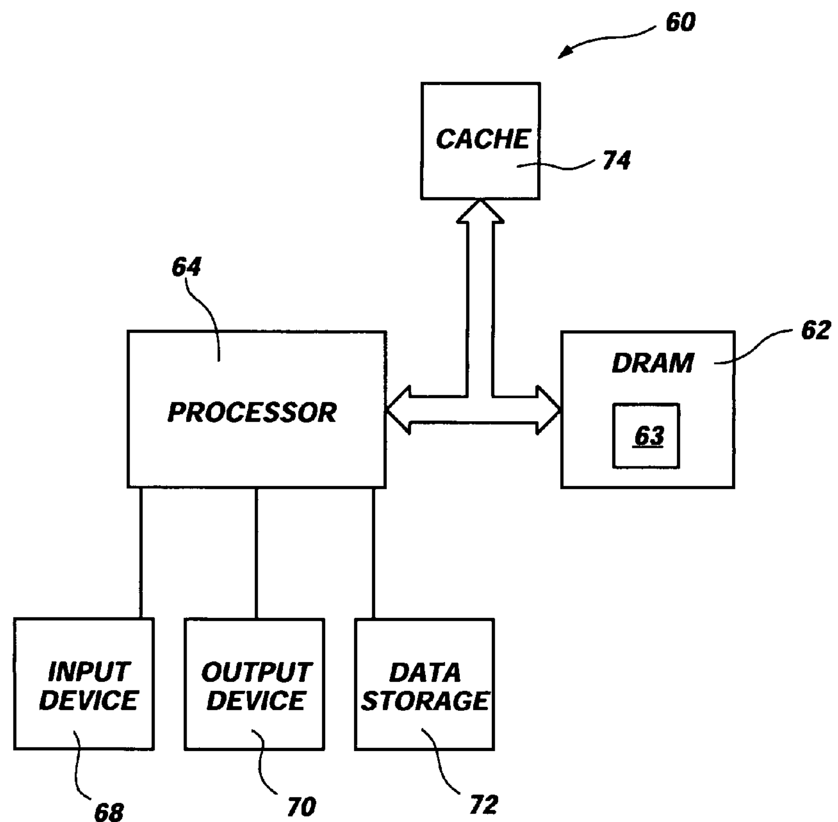
FIG. 5 is a block diagram of a computer system including non-volatile memory in combination with volatile memory according to the present invention.

FIG. 5 is a block diagram of a computer system 60 that includes a memory module 62 tested according to the present invention comprising a plurality of memory devices and at least one non-volatile storage device 63. The computer system 60 includes a processor 64 for performing various computing functions, such as executing specific software to perform specific calculations or tasks. In addition, the computer system 60 includes one or more input devices 68, such as a keyboard or a mouse, coupled to the processor 64 to allow an operator to interface with the computer system 60. Typically, the computer system 60 also includes one or more output devices 70 coupled to the processor 64, such output devices typically being a printer, a video terminal or a network connection. One or more data storage devices 72 are also typically coupled to the processor 64 to store data or retrieve data from external storage media (not shown). Examples of conventional storage devices 72 include hard and floppy disks, tape cassettes, and compact disks. The processor 64 is also typically coupled to a cache memory 74, which is usually static random access memory ("SRAM"), and to the memory module 62.

By using the method and apparatus of the present invention for storing failing part locations in a module, expensive retesting of modules including failed parts may be avoided. Avoiding retesting of failed modules results in a significant cost savings over conventional methods and apparatus requiring such retesting as discussed herein.

Although the present invention has been shown and described with respect to an illustrated embodiment, various additions, deletions and modifications thereto will be apparent to a person of ordinary skill in the art to which the invention pertains and, even if not shown or specifically described herein, are deemed to lie within the scope of the invention as encompassed by the following claims.

What is claimed is:

1. A memory module, comprising:

a memory module carrier substrate;

a plurality of device locations on the memory module carrier substrate, each device location configured for disposition and replacement of a discrete memory device;

a plurality of discrete memory devices, each discrete memory device disposed at one of the plurality of device locations; and at least one discrete non-volatile storage device disposed on the memory module carrier substrate and configured for storing information indicating a failure status of each of the discrete memory devices at each of the plurality of device locations.

2. The memory module of claim 1, wherein at least one discrete memory device of the plurality comprises at least one replacement memory device at a device location of at least one former memory device on the memory module carrier substrate having an indicated failure.

3. The memory module of claim 1, wherein at least a portion of the plurality of discrete memory devices are fully functional dice.

4. The memory module of claim 1, wherein the at least one discrete non-volatile storage device is one of an EEPROM, an EPROM, a ferro-electronic device and a Flash memory chip.

5. The memory module of claim 1, wherein the failure status includes an indication of at least one failed output of the discrete memory device at the device location.

6. A method of testing a memory module, comprising:

testing a memory module including a memory module carrier substrate with a plurality of device locations and a plurality of discrete memory devices, each discrete memory device disposed at one of the plurality of device locations;

defining information for each device location of the plurality, the information indicative of a failure status for the discrete memory device disposed at that device location;

storing the information in at least one discrete non-volatile storage device disposed on the memory module;

accessing the information and identifying a failing device location of at least one failing discrete memory device;

physically removing the at least one failing discrete memory device; and disposing a replacement memory device at the device location of the at least one failing discrete memory device.

7. The method of claim 6, wherein:

testing the memory module includes testing discrete dice as the discrete memory device;

physically removing the at least one failing discrete memory device comprises removing at least one discrete die; and disposing a replacement memory device comprises disposing a replacement die.

8. The method of claim 6, wherein storing the information comprises storing the information on at least one discrete non-volatile storage device selected from the group consisting of an EEPROM, an EPROM, a ferro-electronic device and a Flash memory chip.

9. A method of fabricating a memory module, the method comprising:

disposing a plurality of discrete memory devices at a plurality of device locations on a memory module carrier substrate;

testing at least one aspect of each of the plurality of discrete memory devices;

storing information indicative of at least one device location of at least one failing discrete memory device of the plurality of discrete memory devices;

subsequently accessing the stored information;

removing the at least one failing discrete memory device indicated by the stored information; and disposing at least one substitute discrete memory device at the device location of the at least one failing discrete memory device.

10. The method of claim 9, further comprising testing the at least one substitute discrete memory device on the memory module carrier substrate.

11. The method of claim 9, wherein:

testing at least one aspect includes testing at least one aspect of dice as the discrete memory device;

removing the at least one failing discrete memory device comprises removing at least one die; and disposing at least one substitute discrete memory device comprises disposing at least one substitute die.

12. The method of claim 9, wherein storing the information comprises storing the information on at least one discrete non-volatile storage device selected from the group consisting of an EEPROM, an EPROM, a ferro-electronic device and a Flash memory chip.

13. A computer system, comprising:

a processor; and a memory module operably coupled to the processor and comprising:

a memory module substrate including a plurality of device locations, each device location configured for disposition of a discrete memory device and further configured for replacement of the discrete memory device;

a plurality of discrete memory devices, each discrete memory device disposed at one of the plurality of device locations; and at least one discrete non-volatile storage device disposed on a memory module carrier substrate and configured for storing information indicating a failure status of each of the discrete memory devices at each of the plurality of device locations.

14. The computer system of claim 13, wherein at least one discrete memory device of the plurality comprises at least one replacement memory device at a device location of at least one former memory device on the memory module carrier substrate having an indicated failure.

15. The computer system of claim 13, wherein at least a portion of the plurality of discrete memory devices are fully functional dice.

16. The computer system of claim 13, wherein the at least one discrete non-volatile storage device is one of an EEPROM, an EPROM, a ferro-electronic device and a Flash memory chip.

17. The computer system of claim 13, wherein the failure status includes an indication of at least one failed output of the discrete memory device at the device location.

* * * * *